United States Patent
Schuster et al.

(10) Patent No.: US 6,226,769 B1
(45) Date of Patent: *May 1, 2001

(54) FORWARD ERROR CORRECTION SYSTEM FOR PACKET BASED REAL TIME MEDIA

(75) Inventors: Guido M. Schuster, Des Plaines; Jerry Mahler, Prospect Heights; Ikhlaq Sidhu, Buffalo Grove; Michael Borella, Naperville, all of IL (US)

(73) Assignee: 3Com Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/243,955

(22) Filed: Feb. 3, 1999

Related U.S. Application Data

(63) Continuation of application No. 08/989,483, filed on Dec. 12, 1997, now Pat. No. 5,870,412.

(51) Int. Cl.[7] .................................................. H03M 13/00
(52) U.S. Cl. .......................... 714/752; 714/755; 714/758
(58) Field of Search .............................. 370/514; 341/51; 714/755, 752, 774, 781; 348/423, 6; 382/239

(56) References Cited

U.S. PATENT DOCUMENTS

| | | | |
|---|---|---|---|
| 5,003,535 | * 3/1991 | May, Jr. et al. ...................... | 370/514 |
| 5,115,436 | * 5/1992 | McAuley .............................. | 714/781 |
| 5,389,922 | * 2/1995 | Seroussi et al. ...................... | 341/51 |
| 5,428,629 | 6/1995 | Gutman et al. ...................... | 371/37.1 |
| 5,563,887 | 10/1996 | Harasaki et al. ..................... | 714/756 |
| 5,583,562 | 12/1996 | Birch et al. ........................... | 348/12 |
| 5,600,663 | * 2/1997 | Ayanoglu et al. .................... | 714/774 |
| 5,608,738 | * 3/1997 | Matsushita ........................... | 714/752 |
| 5,617,541 | 4/1997 | Albanese et al. ................ | 395/200.13 |
| 5,699,369 | 12/1997 | Guha ..................................... | 371/42 |
| 5,703,887 | * 12/1997 | Heegard et al. ...................... | 714/775 |
| 5,757,416 | * 5/1998 | Birch et al. ............................ | 348/6 |
| 5,828,788 | * 10/1998 | Chiang et al. ........................ | 382/239 |
| 5,831,690 | * 11/1998 | Lyons et al. .......................... | 348/423 |
| 5,983,388 | 11/1999 | Friedman et al. .................... | 714/776 |
| 5,993,056 | 11/1999 | Vaman et al. ..................... | 371/37.02 |
| 6,061,820 | 5/2000 | Nakakita et al. ..................... | 714/751 |

FOREIGN PATENT DOCUMENTS

WO 97/38549   10/1997   (WO).

OTHER PUBLICATIONS

Shacham, "Packet Recovery and Error Correction in High-speed Wide–area Networks", 1989 IEEE, pp. 0551–0557.*

Kalathur et al., "Forward Error Correction with Buffer Management in Multimedia ATM Networks", Southcon/94 Conference Record, 1994, pp. 437–444.*

(List continued on next page.)

*Primary Examiner*—Albert De Cady
*Assistant Examiner*—David Ton
(74) *Attorney, Agent, or Firm*—McDonnell Boehnen Hulbert & Berghoff

(57) ABSTRACT

A computationally simple yet powerful forward error correction code scheme for transmission of real-time media signals, such as digitized voice, video or audio, in a packet switched network, such as the Internet. The invention appends to each of a series of payload packets a single forward error correction code that is defined by taking the XOR sum of a preceding specified number of payload packets. The invention thereby enables correction from the loss of multiple packets in a row, without significantly increasing the data rate or otherwise delaying transmission.

17 Claims, 6 Drawing Sheets

Microfiche Appendix Included
(2 Microfiche, 54 Pages)

OTHER PUBLICATIONS

Shachnam, N. et al., "Packet Recovery in High–Speed Networks Using Coding and Buffer Management", Information and Telecommunication Sciences Center SRI Int'l, INFOCOM 1990 Conference Publication.

International Search Report for PCT Application Serial No. PCT/US98/26421, Dated Jul. 7, 1999.

Aghadavoodi Jolfaei, M. et al., *Improved Selective Repeat ARQ Schemes for Data Communication*, Proceedings of the Vehicular Technology Conference, Stockholm, vol. 3, No. Conf. 44, pp. 1407–1411 (Jun. 8–10, 1994).

McAuley, Anthony J., "Reliable Broadband Communication Using a Burst Erasure Correcting Code," Bellcore Computer Communication Research Group (1990), pp. 297–306.

Sherman, Ken, "Packet Switching," Data Communications (1990), chapter 17, pp. 384–407.

Feher, Kamilo, "Coding: Error Correction and Detection," in *Wireless Digital Communications: Modulation and Spread Spectrum Applications*, (1995), chapter 5, Prentice–Hall PTR, Upper Saddle River, New Jersey, pp. 254–284.

Bolot, Jean–Chrysostome et al., "Adaptive Error Control for Packet Video in the Internet", Proceedings of IEEE International Conference on Image Processing, Sep., 1996.

Budge, D. et al., "Media–Independent Error Correction Using RTP", *Audio–Video Transport Working Group—Internet Draft*, May 1997, pp. 1–17.

Nonnenmacher, Jorg et al., "Parity–Based Loss Recovery for Reliable Multicast Transmission," (1997), pp. 289–300.

"Draft New Recommendation T.38 (T.Ifax2): Procedures for Real Time Group 3 Facsimile Communication Between Terminals Using IP Networks," International Telecommunication Union Telecommunication Standardization Sector, Study Group 8—Contribution 50 (Feb. 1998).

* cited by examiner

Fig. 7

Sequence of Windows of Analysis

| Step | Action | Window of Analysis |
|---|---|---|
| 1 | Recover lost data block 12 | 9 to 13 |
| 2 | Move window to bubbles 12-16 | 12 to 16 |
| 3 | No recovery | 11 to 15 |
| 4 | No recovery | 10 to 14 |
| 5 | No recovery | 9 to 13 |
| 6 | No recovery; Complete "inner loop" | 8 to 12 |
| 7 | No recovery | 7 to 11 |
| 8 | No recovery | 6 to 10 |
| 9 | No recovery; Complete "outer loop" | 5 to 9 |

FORWARD ERROR CORRECTION SYSTEM FOR PACKET BASED REAL TIME MEDIA

RELATED APPLICATIONS

This application is a continuation of U.S. patent application Ser. No. 08/989,483 filed Dec. 12, 1997, now U.S. Pat. No. 5,870,412.

MICROFICHE APPENDIX

This document contains a microfiche appendix, which consists of 2 sheets of microfiche and a total of 54 frames.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

The present invention relates to packet switched telecommunications networks and more particularly to a system for correcting loss of data packets in such a network.

In a packet switched network, a message to be sent is divided into blocks, or data packets, of fixed or variable length. The packets are then sent individually over the network through multiple locations and then reassembled at a final location before being delivered to a user at a receiving end. To ensure proper transmission and re-assembly of the blocks of data at the receiving end, various control data, such as sequence and verification information, is typically appended to each packet in the form of a packet header. At the receiving end, the packets are then reassembled and transmitted to an end user in a format compatible with the user's equipment.

A variety of packet switching protocols are available, and these protocols range in degree of efficiency and reliability. Those skilled in the art are familiar, for instance, with the TCP/IP suite of protocols, which is used to manage transmission of packets throughout the Internet. Two of the protocols within the TCP/IP suite, as examples, are TCP and UDP.

TCP is a reliable connection-oriented protocol, which includes intelligence necessary to confirm successful transmission between sending and receiving ends in the network. According to TCP, each packet is marked in its header with a sequence number to allow the receiving end to properly reassemble the packets into the original message. The receiving end is then typically configured to acknowledge receipt of packets and expressly request the sending end to re-transmit any lost packets. UDP, in contrast, is an unreliable connectionless protocol, which facilitates sending and receiving of packets but does not include any intelligence to establish that a packet successfully reached its destination.

In the Internet, loss of entire packets has been found to occur at a rate of over 20% when the network is very congested. Typically, this packet loss occurs one packet at a time. However, at times, multiple sequential packets in a row may be lost. In either case, as those skilled in the art will appreciate, a connection-oriented protocol such as TCP introduces delay into packet transmission, due to its need to confirm successful transmission and to request retransmission of these lost packets. While this delay may not be a significant problem in the transmission of pure data signals (such as an e-mail message), the delay can unacceptably disrupt the transmission of real-time media signals (such as digitized voice, video or audio). Therefore, a need exists for a improved system of responding to and correcting packet loss errors.

SUMMARY OF THE INVENTION

The present invention provides a computationally simple yet powerful system for handling packet loss that may arise in the communication of real time media signals, such as digitized voice, video or audio, in a packet switched network. The invention generates and appends to each of a series of payload packets a forward error correction code that is defined by taking the XOR sum of a predetermined number of preceding payload packets. In this way, a receiving end may extract lost payload from the redundant error correction codes carried by succeeding packets and may correct for the loss of multiple packets in a row.

Beneficially, regardless of the number of packets in a row to be recovered by this correction scheme, the size of the forward error correction code employed by the present invention is of the same order as the payload itself. The present invention does not increase the packet rate or introduce significant delay into the transmission process.

These as well as other advantages of the present invention will become apparent to those of ordinary skill in the art by reading the following detailed description, with appropriate reference to the accompanying drawings.

BRIEF DESCRIPTION OF THE DRAWINGS

A preferred embodiment of the present invention is described herein with reference to the drawings, in which:

FIG. 7 lists the steps depicted in FIG. 6.

DETAILED DESCRIPTION OF THE PREFERRED EMBODIMENT

Figure 1:
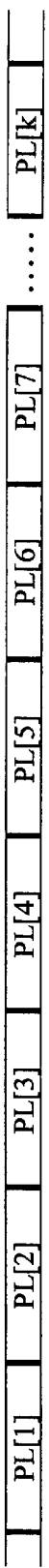
FIG. 1 depicts a payload data stream divided into payload packets PL[k]

The present invention provides an improved system for communicating substantially real time media signals through an unreliable digital transmission channel. The invention may find particular use for transmission of digitized video or audio (including, for instance, voice) signals over the Internet. In the preferred embodiment, the invention employs a computationally simple error correction scheme that enables the recovery of lost data packets within specified limits, while beneficially adding very little delay in transmission time.

For purposes of illustration, the following description will assume that an audio or video signal has been converted into a digital data stream and is to be transmitted in a network from a first node to a second node. It will be appreciated, of course, that the invention is not restricted to use in a traditional network configuration but may extend to any communication path through which a sequence of packets are transmitted, including, for instance, a direct path. In the preferred embodiment, however, the signal at issue is to be transmitted between nodes of a network such as the Internet.

The description will further assume by way of example that the digital data stream, or payload, has been divided into a sequence of frames or payload packets, PL[1], PL[2], PL[3], PL[4], PL[5], PL[6], . . . , PL[k]. A source data stream divided into these packets is illustrated for example in FIG. 1. In this example, each of these payload packets consists of a set number of bytes or bits and preferably represents a portion of a signal to be transmitted through a network.

This description additionally assumes that the packets will be transmitted in a network according to a packet switching protocol that employs a bit-wise or other high resolution verification scheme such as a checksum or parity bit. Therefore, it will be assumed that a technique is in place to respond to loss of some portion of a successfully transmitted packet. Remaining at issue, however, is how to correct for loss of one or more entire packets.

As discussed in the Background section above, the TCP protocol offers one method for responding to loss of packets in a digital transmission network. According to TCP, the receiving node may be configured to acknowledge receipt of packets and expressly request the transmitting node to retransmit any lost packets. This request and retransmission system is generally accurate. However, as noted above, the system is not well suited for use in the context of real-time media transmissions, because the transmission of such signals is very sensitive to the delay introduced by retransmission requests.

Rather than employing a request and retransmission system, greater efficiency in packet loss correction may be achieved by transmitting a correction code of some sort concurrently with the payload data, thereby providing the receiving end with sufficient information to recover lost packets. Several error correction code mechanisms are available for this purpose. These mechanisms include, for instance, interleaving and block coding.

Interleaving is commonly used in wireless communications, providing an effective method to combat error bursts that occur on a fading channel. Interleaving generally calls for spreading the bits of each codeword (or payload packet) apart from each other so they experience independent fading and so that the original data may be more readily recovered.

Block coding, in turn, calls for mapping a frame of binary source data into a coded block of data that includes a set of redundant parity symbols. By conventional terminology, a block coder typically converts a group of k payload units (such as bytes or bits) into a larger group of n units by appending p=n−k parity units or forward error correction (FEC) codes to the group. Each parity packet is generated through a predetermined coding technique based on all or some subset of the k payload units. One of the simplest forms of a block code is a repetition code, in which the binary source data is repeated as a set of parity bits. One of the more popular but complex block codes is the Reed-Solomon (RS) class of codes over the $2^8$ Galois field. These codes are optimal in their ability to correct erased bytes. For example, provided that 8 bytes are protected with 3 parity bytes (a total of 11 bytes), any three bytes can be lost, and the original 8 bytes may still be recovered.

Unfortunately, however, the addition of redundant parity packets gives rise to increased complexity and delays in transmission. In a packet switched network, routers route packets based on information contained in the packet headers. Therefore, the amount of work performed by a packet router generally relates directly to the number of packets being routed. Because each packet, whether payload or parity, contains its own header, an increase in packet rate consequently increases the burden on network routers and could delay transmission time or, in theory, cause a network to fail.

Adding separate parity packets to the transmission sequence is a particular waste of resources when done in the context of some of the more common real-time media transmission protocols, because many of the existing protocols add substantial overhead to each packet For instance, the G.723.1 voice coder provides 24 bytes of payload every 30 milliseconds, but RTP/UDP/IP adds a 50 byte header to each payload packet. A parity block destined for the same receiving end as an adjacent payload block would have a header almost identical to the header of the payload block. Yet the parity packet would still require the fill 44 bytes of overhead, resulting in a waste of bandwidth. As this example illustrates, traditional block coding techniques are therefore not well suited for correcting packet loss in real time media transmissions.

To avoid an increase in packet rate, another technique for providing parity information is to append redundant parity information to existing payload packets. For instance, as an offshoot of traditional repetition codes, the transmitting node may append to each payload packet redundant copies of the preceding n number of payload packets. In this way, the receiving end may readily recover a lost packet PL[k] from one of the n subsequent packets PL[k+1] . . . PL[k+n]. For instance, with n=2, payload packets PL[k−1] and PL[k−2] would be redundantly appended to and transmitted together with payload packet PL[k], providing the following transmission packets P[k], for example:

| | | | | |
|---|---|---|---|---|
| $P[1]$ | = | {$PL[1]$, | $PL[0]$, | $PL[-1]$} |
| $P[2]$ | = | {$PL[2]$, | $PL[1]$, | $PL[0]$} |
| $P[3]$ | = | {$PL[3]$, | $PL[2]$, | $PL[1]$} |
| $P[4]$ | = | {$PL[4]$, | $PL[3]$, | $PL[2]$} |
| $P[5]$ | = | {$PL[5]$, | $PL[4]$, | $PL[3]$} |
| $P[6]$ | = | {$PL[6]$, | $PL[5]$, | $PL[4]$} |
| $P[7]$ | = | {$PL[7]$, | $PL[6]$, | $PL[5]$} |
| $P[8]$ | = | {$PL[8]$, | $PL[7]$, | $PL[6]$} |
| $P[9]$ | = | {$PL[9]$, | $PL[8]$, | $PL[7]$} |
| * * * | | | | |
| $P[k]$ | = | {$PL[k]$, | $PL[k-1]$, | $PL[k-2]$} |

With this scheme, in the event a payload packet is lost in transmission, the receiving end may simply extract a redundant copy of the payload from one of the n subsequent data packets.

By appending n preceding payload packets to each current data packet P[k], it becomes possible to recover n lost packets in a row without having to request retransmission. As more preceding packets are concatenated with each current packet, the network can tolerate a higher rate of packet loss. Additionally, this method will not affect the packet rate or routing rate, since, as noted above, the routing rate is concerned principally with the header information in a given packet, rather than with the size of each packet. Unfortunately, however, by concatenating multiple payload packets, this method necessarily and substantially increases the data rate. For instance, to be able to correct for two lost packets in a row (n=2) this method nearly triples the size of every packet. Therefore, this method is also not desirable.

Instead, the present invention beneficially provides a suitable and less costly scheme of correcting for packet loss, adding very little delay to transmission time. The invention preferably employs a coding technique in which parity bits associated with current packets are piggy-backed onto future packets. Rather than concatenating multiple previous payload packets with each current payload packet (and thus greatly raising the data rate), the preferred embodiment of the present invention calls for concatenating a single forward error correction (FEC) code (block code, or redundancy block) with each payload packet in a way that enables the recovery of multiple lost packets in a row.

According to a preferred embodiment of the present invention, the single FEC appended to each payload packet is about the same size as the payload packet and is computed by taking the XOR (exclusive-or, or $\oplus$) product of a predetermined number w of preceding payload packets, where w is preferably more than 1. In turn, at the receiving end, if a packet is lost, the associated payload may be extracted from the XOR sum carried by one or more subsequent data packets.

Figure 2:
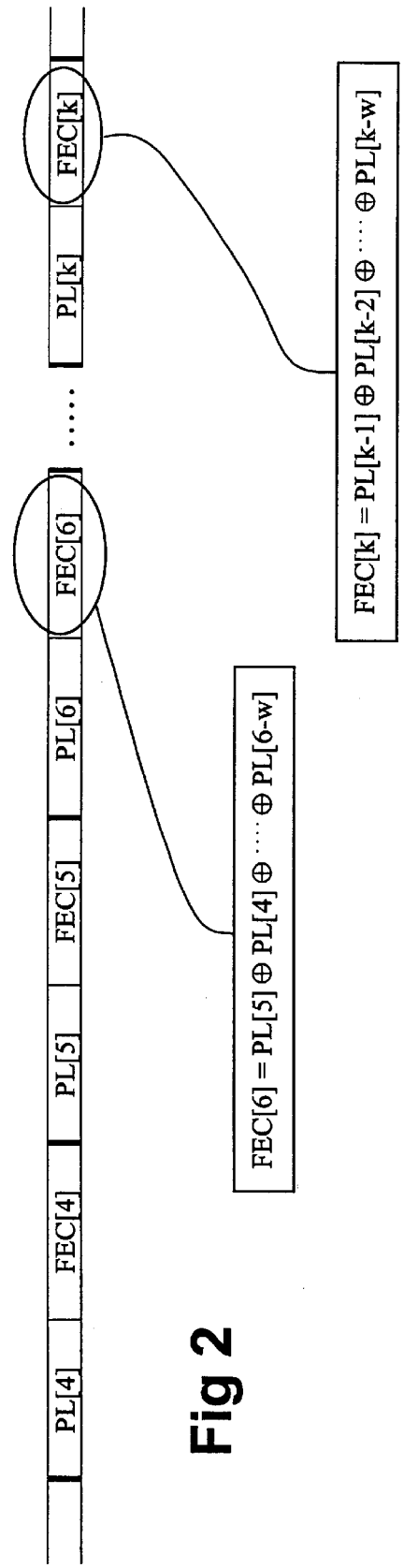
FIG. 2 depicts an output data stream coded in accordance with a preferred embodiment of the present invention, including packets of the form P[k]={PL[k], FEC[k]}.

In general, the present invention therefore calls for building a forward error correction code FEC[k] for each payload packet P[k], where FEC[K]=PL[k−1]$\oplus$PL[k−2]$\ominus$ . . . , $\ominus$PL[k−w], and where w is a positive integer generally greater than 1. This FEC[k] is then piggy-backed onto the payload PL[j], where j>k. The resulting packet P[k] is therefore the concatenation of the payload and the FEC: P[k]={PL[k], FEC[k]}. FIG. 2 illustrates a data stream containing a sequence of packets concatenated with their associated forward error correction codes in this fashion.

The predetermined number w defines a sliding window over which the XOR operation is taken and, as a result, defines the length of a burst error, or number of lost packets in a row, from which the system is able to recover. As a block coder that adds a single redundancy block to each data packet based on the previous w data packets, the present invention may be understood to employ (n, k) values of k=w, and n=k+1.

Thus, for instance, if the sliding window w is 5, then the (n, k) values of the XOR block coder according to the present invention are (6, 5).

By repeatedly generating block codes according to a sliding window over a sequence of packets, the packet data is used in several block codes rather than in only a single block code. Consequently, the present invention provides a high order redundancy and enables the recovery of multiple lost packets in a row, while requiring only a single redundancy block per packet.

Figure 3:
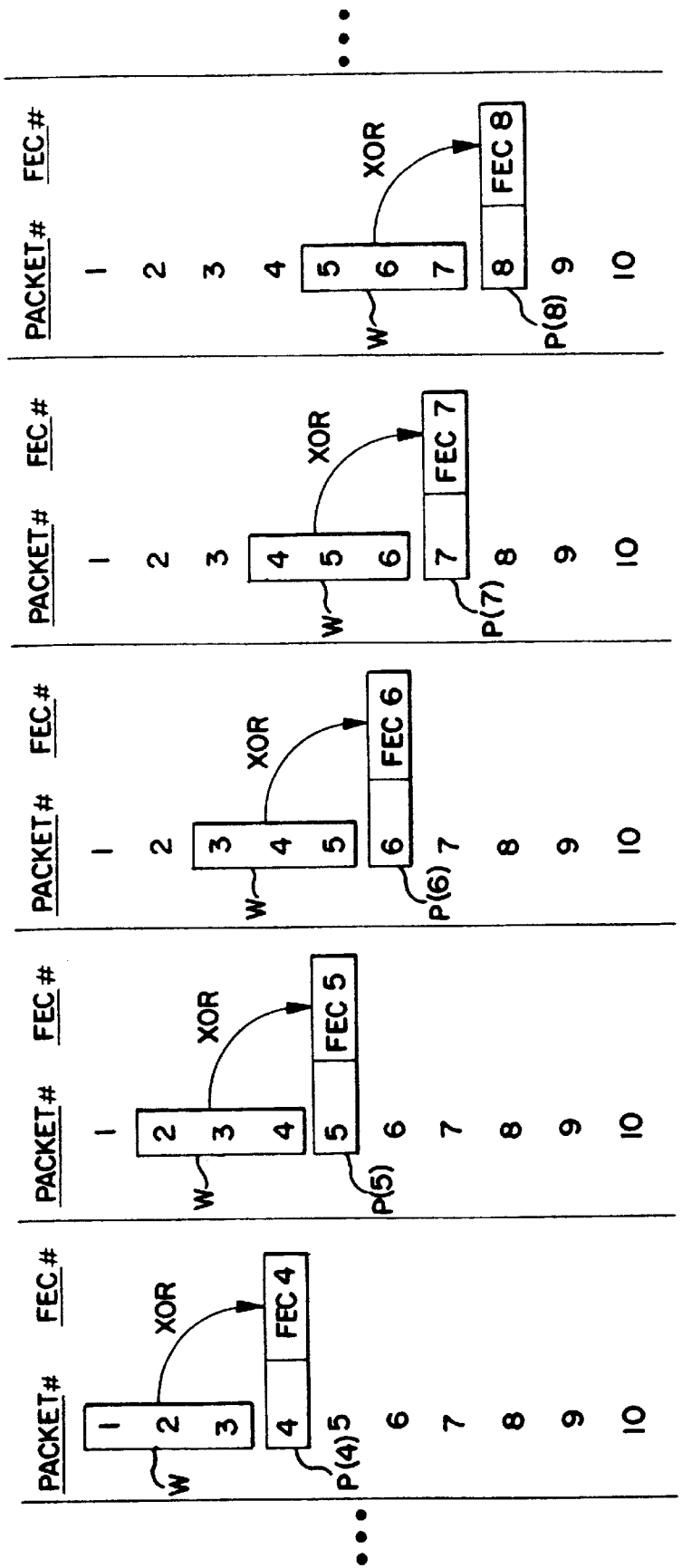
FIG. 3 depicts several stages of an encoder operating in a preferred embodiment of the present invention.

To better understand the operation of this sliding window, FIG. 3 depicts several stages of an encoder operating in a preferred embodiment of the invention. FIG. 3 assumes that 10 packets (numbered 1–10) are to be transmitted in a network and that the window size w is 3. In the first stage shown, the window w covers payload packets PL[1]–PL[3], so that the encoder computes FEC[4]=PL[1]$\ominus$PL[2]$\ominus$PL[3]. The encoder then appends this FEC[4] redundancy block to payload packet PL[4] and outputs the resulting packet P[4]={PL[4], FEC[4]} for transmission to the receiving end. In turn, in the next stage shown, the window w covers payload packets P[2]–P[4], so that the encoder computes FEC[5]=PL[2]$\ominus$PL[3]$\ominus$PL[4]. The encoder then appends this FEC[5] redundancy block to payload packet PL[5] and outputs the resulting packet P[5]={PL[5], FEC[5]} for transmission to the receiving end. As partially illustrated in the figure, this process continues as long as the sequence of payload packets continues.

The use of the XOR operation presumes that the packets being combined are of the same length (for instance, the same number of bits). The present invention, however, will work equally well in a network of variable length packets. Provided with packets of various lengths, the invention contemplates padding the shorter packets with zeros, so that all packets combined in a single XOR operation, as well as the resulting XOR sum, will be the length of the longest among them. Once the XOR coding operation is complete, the extra zeros are dropped from each padded packet, and the unpadded packet is output for transmission to the network (together with a redundancy block based on the previous w packets). In this variation, extra codes may be added to the header to indicate the lengths of the data block and the redundancy block, in order to facilitate decoding in accordance with the invention.

It should be further appreciated, of course, that the FEC contemplated by the present invention is not restricted to being equal to the above-described XOR sum, but may include other modifications as necessary. For instance, the present invention would extend to the use of an FEC that is computed by taking an XOR sum of the previous w payload packets and then inverting one or more predetermined digits or cyclically shifting the code or resulting packet. Additionally, it will be understood that the above equation is set forth for purposes of illustration only and that the present invention is not necessarily limited to employing the XOR sum of 3 or more (k−1, k−2, . . . , k−w) preceding payload packets; the invention may, for instance, extend to the XOR sum of only the previous two payload packets as well. Still further, it will be appreciated that the sequence illustrated in FIG. 1 is shown for example only; the present invention may equally extend to separate and independent transmission of packets P[k]={PL[k], FEC[k]} through a packet switched network.

As a general example of the encoding and decoding process contemplated by the present invention, the following illustrates the structure of a series of payload packets P[k] generated by an encoder, given payload frame PF[k] and a window w=3:

$P[1] = \{PL[1], FEC[1]\} = \{PL[1], PL[0] \oplus PL[-1] \oplus PL[-2]\}$ $P[2] = \{PL[2], FEC[2]\} = \{PL[2], PL[1] \oplus PL[0] \oplus PL[-1]\}$ $P[3] = \{PL[3], FEC[3]\} = \{PL[3], PL[2] \oplus PL[1] \oplus PL[0]\}$ $P[4] = \{PL[4], FEC[4]\} = \{PL[4], PL[3] \oplus PL[2] \oplus PL[1]\}$ $P[5] = \{PL[5], FEC[5]\} = \{PL[5], PL[4] \oplus PL[3] \oplus PL[2]\}$ $P[6] = \{PL[6], FEC[6]\} = \{PL[6], PL[5] \oplus PL[4] \oplus PL[3]\}$ $$P[7] = \{PL[7], FEC[7]\} = \{PL[7], PL[6] \oplus PL[5] \oplus PL[4]\}$$

$$P[8] = \{PL[8], FEC[8]\} = \{PL[8], PL[7] \oplus PL[6] \oplus PL[5]\}$$

$$P[9] = \{PL[9], FEC[9]\} = \{PL[9], PL[8] \oplus PL[7] \oplus PL[6]\}$$

$$* * * =$$

$$P[k] = \{PL[k], FEC[k]\} = \{PL[k], PL[k-1] \oplus PL[k-2] \oplus PL[k-3]\}$$

Assume that packet P[5] was lost in transmission. With the present invention, a decoder may recreate packet P[5] by using the FEC of the packets in which packet P[5] was included. In this case, since w=3, the three packets following packet P[5] are each based in part on the value of payload packet PL[5]. Consequently, payload packet PL[5] may be recovered by solving any of the equations defining these three packets. For instance, using packet P[8], $$FEC[8] = PL[7] \ominus PL[6] \ominus PL[5],$$

and $$PL[5] = FEC[8] \ominus PL[7] \ominus PL[6].$$

This example may be extended to illustrate that, provided with a window w=3, the present invention enables the recovery of three packets lost in a row. Assume, for instance, that packets P[4], P[5] and P[6] are lost. In order to recover the payload carried by these lost packets, the subsequent three packets, P[7], P[8] and P[9], will need to have arrived successfully. Provided with these three packets, the receiving end may first extract payload packet PL[6] from FEC[9] as follows:

$$FEC[9] = PL[8] \ominus PL[7] \ominus PL[6],$$

and $$PL[6] = FEC[9] \ominus PL[8] \ominus PL[7].$$

Next, the receiving end may extract payload packet PL[5] from FEC[8] as follows:

$$FEC[8] = PL[7] \ominus PL[6] \ominus PL[5],$$

and $$PL[5] = FEC[8] \ominus PL[7] \ominus PL[6].$$

Finally, the receiving end may extract payload packet PL[4] from FEC[7] as follows:

$$FEC[7] = PL[6] \ominus PL[5] \ominus PL[4],$$

and $$PL[4] = FEC[7] \ominus PL[6] \ominus PL[5].$$

The foregoing illustrates a straightforward mechanism for recovering lost data within the present invention. This mechanism works well when the transmitted packets arrive in sequence, as would occur with the transmission of ATM cells. With packets arriving in sequence, a lost packet can be recovered as soon as the next w packets successfully arrive. In many transmission systems, however, sequentially numbered packets that are sent in order through a network do not arrive at the receiving end in their original sequence.

Figure 4:
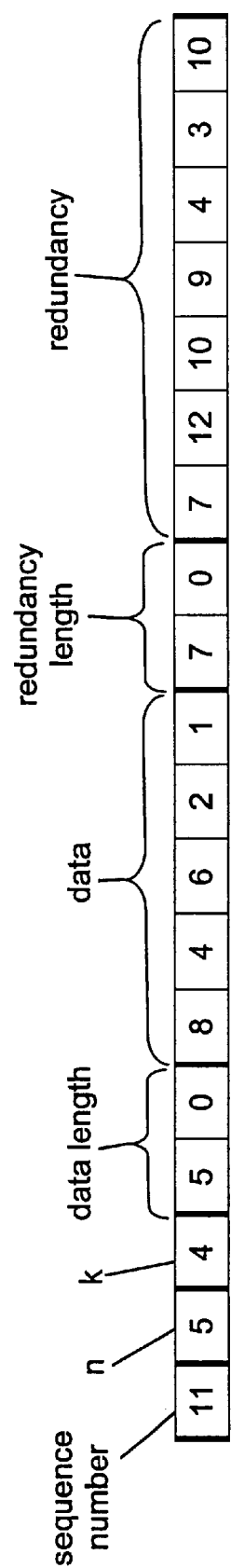
FIG. 4 depicts a packet encoded in accordance with a preferred embodiment of the present invention.

To enable more robust recovery of lost packets, a preferred embodiment of the invention preferably operates as follows. At the sending end, an encoder translates incoming data into packets, using the XOR encoding mechanism of the present invention. As described above, this XOR encoder employs a sliding window w, such that the n and k values of the block coder are (n=k+1, k=w). Each packet preferably includes an indication of the sequence number (packet number), the (n, k) values, a payload/data block and a redundancy block. Additionally, to account for possible variation in packet length, each packet also preferably includes an indication of data length and an indication of redundancy length. FIG. 4 illustrates an example of a packet containing this information, where the encoder employs a sliding window w of 4 (and, therefore, k=4).

At the receiving end, a decoder is in place to receive these packets and recover any lost packets that can be recovered. According to the preferred embodiment of the invention, as the decoder receives a packet, it stores the packet in memory, parses the packet into its components, and creates a "bubble" of information (for instance, a "c"-structure), containing the sequence number, and pointers to the data block and the redundancy block in the packet. The decoder then places the bubble into a doubly linked list by storing a pointer to the bubble. Additionally, the decoder preferably passes the data block downstream for use by other elements in the transmission system.

Figure 5:
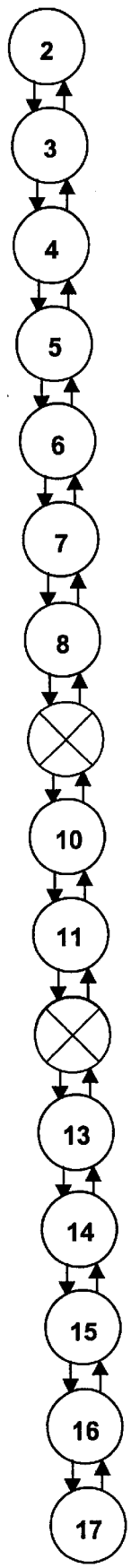
FIG. 5 depicts a link list compiled by a decoder operating in accordance with a preferred embodiment of the present invention.
Figure 6:
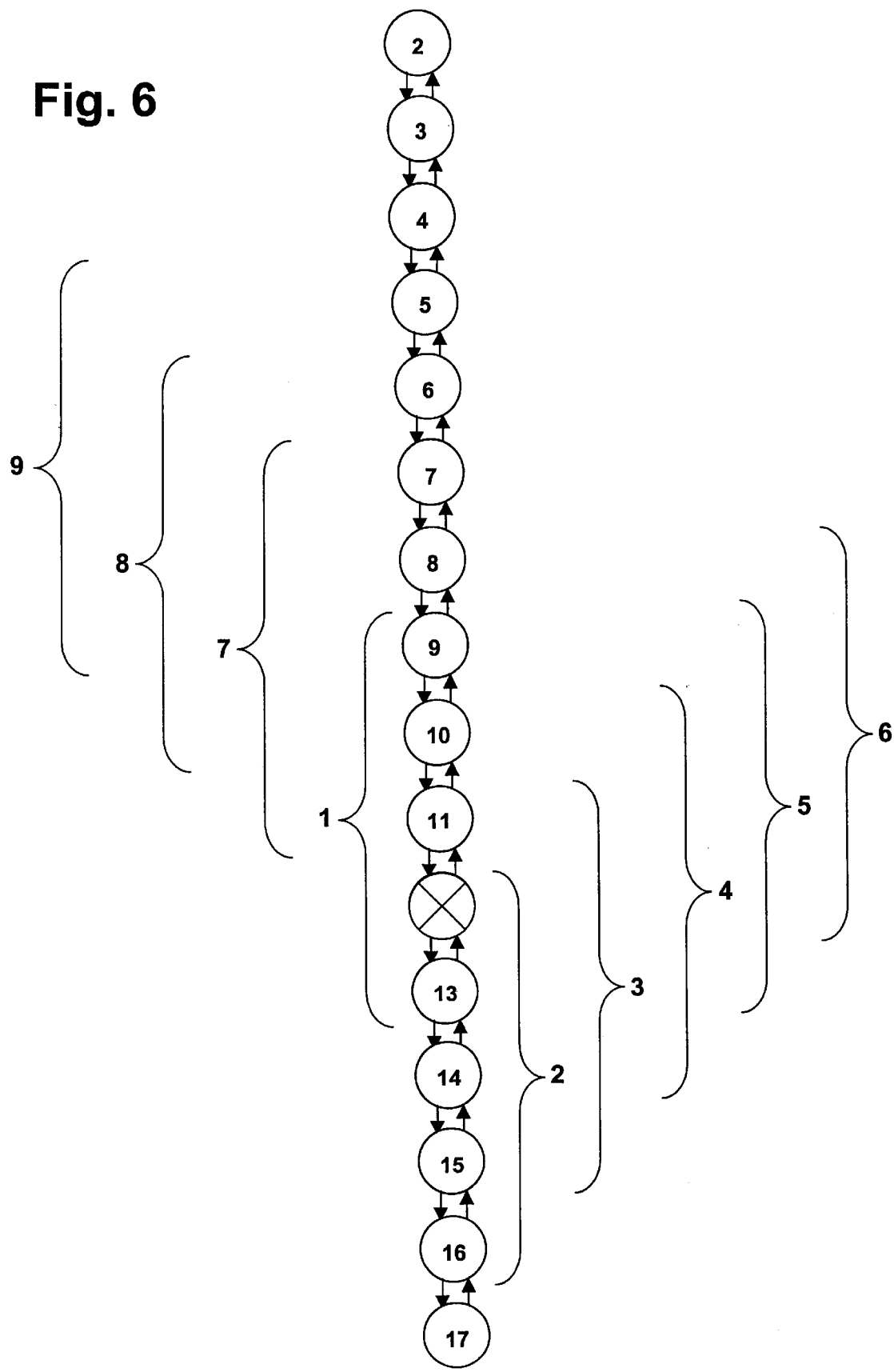
FIG. 6 depicts the analysis steps performed by a decoder operating in accordance with a preferred embodiment of the present invention.

In the preferred embodiment, each time the decoder receives new information and adds a bubble to the link list, it determines whether the information in the bubble can help to recover any missing information. For example, FIG. 5 illustrates a series of bubbles 2–17 compiled by a sample decoder. As shown by FIG. 5, assume that bubbles 9 and 12 are missing, but the decoder has so far received packets sufficient to provide the information needed for bubbles 2–8, 10–11 and 13–17. Assume now that packet 9 arrives. The decoder receives packet 9 and inserts bubble 9 in the link list, to obtain a revised link list shown in FIG. 6.

Because the sliding window w in this example is 4 (as established by the value of k included in each received packet), the decoder knows that, in an ordered sequence of packets, each packet is related through an XOR operation with the preceding 4 packets as well as with the following 4 packets. In the present example, therefore, the decoder knows that the information newly received from packet number 9 can help to recover lost data, if any, in bubbles 5–8 and 10–13. This range may be referred to as the relevant range with respect to newly received packet number 9. Knowing this relevant range conveniently limits the work that the decoder needs to do when it receives a new packet in order to decide whether the information can help in some way.

In the preferred embodiment, the decoder analyzes the relevant range (5–13 in this example) as follows. The decoder begins at the end of the range by considering bubbles 9–13, which may be referred to as a window of analysis. In this window of analysis, the decoder first determines whether there is exactly one data block missing in the range 9–12 that the redundancy block 13, which needs to be in the linked list, can help recover (through the XOR operation). If more than one data block is missing in the range 9–12, the decoder knows that it cannot, with the XOR operation, recover any data in the window of analysis. In that case, or in the event the decoder finds no missing data in the window of analysis, then the decoder moves the window of analysis up one notch and repeats this analysis, now for the window of analysis defined by bubbles 8–12. The decoder continues this process until it completes its analysis with the top of the window of analysis at the top of the relevant range, which is bubble 5 in this example.

If the decoder determines that exactly one data block is missing in a given window of analysis, and the last bubble in the analysis window contains a redundancy block, then the decoder may employ the XOR operation as discussed above to recover the missing data block. Once it does so, it will have received a new piece of information, namely, the recovered data block, which should give rise to a new relevant range. As a result, the decoder may jump back to a higher number bubble (i.e., down in the link list), moving the window of analysis to a higher number starting point. The decoder may then continue moving the window of analysis up the link list until the top of the window of analysis has reached the top of the original relevant range.

In this example, for instance, once the window of analysis is over bubbles 9–13, the missing data block 12 can be recovered by taking the XOR sum of data blocks 9, 10 and 11 and redundancy block 13. The decoder will therefore have the newly received information of data block 12, which gives rise to a new relevant range of 8–16 (i.e., 8–12 and 12–16). As a result, the decoder positions a new window of analysis to start over bubbles 12–16 and to move upward bubble-by-bubble as discussed above. For instance, if packet 15 had not yet arrived, but data blocks 12, 13 and 14 and redundancy block 16 had arrived, then the decoder could compute data block 15 using the XOR operation.

It will be appreciated that two window of analysis loops are thus in operation. A first window of analysis loop, or "outer loop," is operating as a result of the receipt of data block 9. A second window of analysis loop, or "inner loop," is operating as a result of the recovery of data block 12. The outer loop is geared to move a window of analysis up the link list until the decoder has completed its analysis of bubbles 5–9. The inner loop, in comparison, is geared to move a window of analysis up the link list until the decoder has completed its analysis of bubbles 8–12.

In order to avoid unnecessary repetition, a decoder operating according to the preferred embodiment of the present invention will complete the inner loop and will then continue moving up the link list to complete the outer loop, without jumping back to where it left off before it began the inner loop. Thus, in the above example, the steps performed by the decoder are illustrated by the brackets in FIG. 6 and by the rows in FIG. 7. As shown in these Figures, at step 1, the decoder first analyzes bubbles 9–13 and recovers lost data block 12. At step 2, the decoder therefore jumps to a window of analysis over bubbles 12–16, where the decoder recovers no new data. At steps 3 through 6, the decoder moves the window of analysis bubble-by-bubble up the link list, until it has completed the inner loop at bubbles 8–12, recovering no new data at each step.

Next, rather than recursively returning to the outer loop and repeating an analysis of bubbles 8–12, the decoder continues moving up the link list from where it left off with the inner loop, analyzing bubbles 7–11 at step 7, bubbles 6–10 at step 8, and bubbles 5–9 at step 9. In this example, the decoder does not recover any additional data along the way. After completing its analysis of bubbles 5–9, the decoder's analysis is complete, and the decoder waits for the arrival of a new packet to begin another analysis.

While an encoder or decoder operating in accordance with the present invention may take any of a variety of forms (such as hardware, software or firmware), both the encoding and decoding functions are preferably carried out by a computer processor or microprocessor operating a set of machine language instructions that are stored in a memory. As an example, the microfiche appendix contains a C++ source code listing, which can be compiled by any standard C++ compiler and executed by an appropriate processor.

The computer processor and/or machine language instructions that carries out the encoding function according to the present invention may be referred to as a first segment of a communication apparatus, and a device that transmits the resulting encoded packets according to the present invention may be referred to as a second segment of the communication apparatus. In turn, the computer processor and/or machine language instructions that recreates a lost payload packet by extracting information from other packets may be referred to as a third segment of the communication apparatus. Alternatively, it will be appreciated that the various components required to carry out the present invention may be divided into other segments of a communication apparatus.

As the foregoing illustrates, the present invention provides a computationally simple mechanism for encoding and decoding a sequence of packets in order to recover lost packets. Beneficially, the invention accomplishes this function without increasing packet rate and without substantially increasing the data rate of transmission beyond the single FEC block (and trivial amount of other overhead) added to each payload packet. As the window size w is increased, provided with successful transmission and receipt of sufficient adjacent data blocks, the present invention conveniently enables the recovery from larger burst errors. The present invention thus provides a powerful mechanism for reducing the effect of packet loss, by establishing high order redundancy through the use of a sliding window and an efficient forward error correction code as described above.

A preferred embodiment of the present invention has been illustrated and described. It will be understood, however, that changes and modifications may be made to the invention without deviating from the spirit and scope of the invention, as defined by the following claims.

We claim:

1. In a packet switched network in which a sequence of packets is transmitted from a first location to a second location, each packet in said sequence containing a payload block, a method comprising, for each given packet of a plurality of packets in said sequence:

generating a parity block comprising an XOR sum of the payload blocks contained in k previous packets of said sequence;

inserting said parity block into said given packet after the payload block in said given packet; and subsequently transmitting said given packet in said packet switched network for receipt at said second location.

2. A method as claimed in claim 1, wherein the payload blocks of said k previous packets vary in length, and said method further comprises:

zero-padding one or more of the payload blocks of said previous k packets, to force said payload blocks to be equal in length to each other; and generating said XOR sum.

3. A method as claimed in claim 1, wherein said parity block has a parity block length, and said method further comprises including in said given packet an indication of said parity block length.

4. A method as claimed in claim 1, further comprising including in a header of said given packet an indication of the number k.

5. A method as claimed in claim 1, wherein, if a packet is lost in transmission, a device at said second location recreates the lost packet by a process comprising extracting information from one or more packets that follow the lost packet.

6. A method as claimed in claim 1, wherein said payload block represents at least part of a real-time media signal.

7. A method as claimed in claim 6, wherein said payload block represents at least part of a voice signal.

8. In a packet switched network in which a sequence of packets is transmitted from a first location to a second location, each packet in said sequence containing a payload block, an apparatus comprising, in combination:

a computer processor;

a memory; and a set of machine language instructions stored in said memory and executed by said processor, for generating and concatenating with the payload block of each of a plurality of said packets a parity block comprising the XOR sum of the payload blocks of a plurality of previous packets of said sequence.

9. An apparatus as claimed in claim 8, wherein said payload block represent at least part of a real-time media signal.

10. An apparatus as claimed in claim 9, wherein said payload block represents at least part of a voice signal.

11. An apparatus for transmitting payload in a digital communications system, said payload being divided into a sequence of payload blocks, each of said payload blocks being contained in a respective packet, said apparatus comprising, in combination:

a first segment for generating, for a given packet, a forward error correction code comprising the XOR sum of the payload blocks of a plurality of previous packets in said sequence;

a second segment for concatenating said forward error correction code with the payload block of said given packet; and a third segment for subsequently transmitting a sequence of said packets, including said given packet, from a first location in said digital communications system to a second location in said digital communications system, whereby, when said sequence of packets is transmitted from said first location in said digital communications system to said second location in said digital communications system, if a packet is lost in said transmission, the payload block of the lost packet may be recreated based on information contained in one or more other packets.

12. An apparatus as claimed in claim 11, wherein said first and second segments each comprise a set of machine language instructions stored in a memory and executable by a computer processor.

13. An apparatus as claimed in claim 11, wherein said payload represents a real-time media signal.

14. An apparatus as claimed in claim 13, wherein said payload represents a voice signal.

15. In a packet switched network in which a sequence of packets is transmitted from a first location to a second location, each packet in said sequence containing a payload block, a method comprising, for each given packet of a plurality of packets in said sequence:

generating a parity block comprising an XOR sum of the payload blocks of a plurality of previous packets of said sequence;

concatenating said parity block with the payload block of said given packet, to thereby produce a modified payload block of said given packet; and subsequently transmitting said given packet, containing said modified payload block, into said packet switched network for receipt at said second location.

16. A method of transmitting a sequence of payload blocks into a packet-switched network, the method comprising, for each given payload block of a plurality of payload block in said sequence:

generating a parity block comprising an XOR sum of a plurality of previous payload blocks in said sequence;

combining said parity block with said given payload block so as to produce a modified payload block; and transmitting said modified payload block into said packet-switched network.

17. A method as claimed in claim 16, wherein transmitting said modified payload block into said packet-switched network comprises transmitting said modified payload block in a packet having a packet header.

\* \* \* \* \*

UNITED STATES PATENT AND TRADEMARK OFFICE
CERTIFICATE OF CORRECTION

PATENT NO.    : 6,226,769 B1
DATED         : May 1, 2001
INVENTOR(S)   : Guido M. Schuster et al.

It is certified that error appears in the above-identified patent and that said Letters Patent is hereby corrected as shown below:

Column 4,
Line 22, please delete "fill" and substitute -- full --
Line 28, please delete "to append" and substitute -- *to append* --

Column 5,
Line 32, please delete "FEC[K]" and substitute -- FEC[k] --
Line 32, please delete "⊖" and substitute -- ⊕, --
Line 33, please delete "⊖" and substitute -- ⊕ --

Column 6,
Line 4, please delete "FEC[4]=PL[1]⊖PL[2]⊖PL" and substitute
-- FEC[4]=PL[1]⊕PL[2]⊕PL --
Line 10, please delete "FEC[5]=PL[2]⊖PL[3]⊖PL[4]" and substitute
-- FEC[5]=PL[2]⊕PL[3]⊕PL[4] --

Column 7,
Line 6, please delete "* =" and substitute -- * --
Line 21, please delete "FEC[8]=PL[7]⊖PL[6]⊖PL[5]" and substitute
-- FEC[8]=PL[7]⊕PL[6]⊕PL[5] --
Line 25, please delete "PL[5]=FEC[8]⊖PL[7]⊖PL[6]" and substitute
-- PL[5]=FEC[8]⊕PL[7]PL⊕[6]" --
Line 38, please delete "FEC[9]PL[8]⊖PL[7]⊖PL[6]" and substitute
-- FEC[9]=PL[8]⊕PL[7]⊕PL[6] --
Line 42, please delete "PL[6]=FEC[9]⊖PL[8]⊖PL[7]" and substitute
-- PL[6]=FEC[9]⊕PL[8]⊕PL[7] --
Line 48, please delete "FEC[8]=PL[7]⊖PL[6]⊖PL[5]" and substitute
-- FEC[8]=PL[7]⊕PL[6]⊕PL[5] --
Line 52, please delete "PL[5]=FEC[8]⊖PL[7]⊖PL[6]" and substitute
-- PL[5]=FEC[8]⊕PL[7]⊕PL[6] --

UNITED STATES PATENT AND TRADEMARK OFFICE
CERTIFICATE OF CORRECTION

PATENT NO. : 6,226,769 B1
DATED : May 1, 2001
INVENTOR(S) : Guido M. Schuster et al.

It is certified that error appears in the above-identified patent and that said Letters Patent is hereby corrected as shown below:

Column 7, cont'd,
Line 58, please delete "FEC[7]=PL[6]⊖PL[5]⊖PL[4]" and substitute
-- FEC[7]=PL[6]⊕PL[5]⊕PL[4] --
Line 62, please delete "PL[4]=FEC[7]⊖PL[6]⊖PL[5]" and substitute
-- PL[4]=FEC[7]⊕PL[6]⊕PL[5] --

Signed and Sealed this

Thirtieth Day of March, 2004

JON W. DUDAS
*Acting Director of the United States Patent and Trademark Office*